(12) United States Patent  
Koyama et al.

(10) Patent No.: US 11,822,319 B2  
(45) Date of Patent: Nov. 21, 2023

(54) SEMICONDUCTOR SYSTEM

(71) Applicant: Tokyo Electron Limited, Tokyo (JP)

(72) Inventors: Noriaki Koyama, Yamanashi (JP); Kazushi Shoji, Sapporo (JP); Motokatsu Miyazaki, Sapporo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 258 days.

(21) Appl. No.: 17/015,343

(22) Filed: Sep. 9, 2020

(65) Prior Publication Data

US 2021/0043459 A1 Feb. 11, 2021

Related U.S. Application Data

(63) Continuation of application No. 15/662,504, filed on Jul. 28, 2017, now abandoned.

(30) Foreign Application Priority Data

Aug. 5, 2016 (JP) .................................. 2016-154283

(51) Int. Cl.  
*G05B 19/418* (2006.01)  
*G06Q 50/04* (2012.01)  
(Continued)

(52) U.S. Cl.  
CPC ..... *G05B 19/4184* (2013.01); *G05B 19/4185* (2013.01); *G05B 19/41875* (2013.01);  
(Continued)

(58) Field of Classification Search  
CPC ............ G05B 19/4184; G05B 19/4185; G05B 19/41875; G05B 19/41815; G06Q 50/04;  
(Continued)

(56) References Cited

U.S. PATENT DOCUMENTS 5,895,596 A 4/1999 Stoddard et al.  
6,213,853 B1 4/2001 Gonzalez-Martin et al.  
(Continued)

FOREIGN PATENT DOCUMENTS

JP 11-340111 A 12/1999  
JP 2003-217995 A 7/2003  
(Continued)

OTHER PUBLICATIONS

K. Boyd, A. Monkowski, J. Chen, T. Ding, R. Malone and J. Monkowski, "A new device for highly accurate gas flow control with extremely fast response times," 2011 IEEE/SEMI Advanced Semiconductor Manufacturing Conference, 2011, pp. 1-5, doi: 10.1109/ASMC.2011.5898201. (Year: 2011).*

*Primary Examiner* — Thomas C Lee  
*Assistant Examiner* — Tyler Dean Hedrick  
(74) *Attorney, Agent, or Firm* — Venjuris, P.C.

(57) ABSTRACT

A semiconductor system shares information on a semiconductor manufacturing apparatus between first and second semiconductor manufacturing apparatuses through direct communication. The first semiconductor manufacturing apparatus includes a first acquisition unit acquiring first information on the first semiconductor manufacturing apparatus, a first storage unit storing the acquired first information, and a first communication unit sending the stored first information to the second semiconductor manufacturing apparatus. The second semiconductor manufacturing apparatus includes a second acquisition unit acquiring second information on the second semiconductor manufacturing apparatus, a second storage unit storing the acquired second information, a second communication unit receiving the first information sent from the first semiconductor manufacturing apparatus, an analysis unit analyzing a state of the second semiconductor manufacturing apparatus based on the received first information and the stored second information, (Continued)

an information generation unit generating information visualizing an analysis result, and a display unit displaying the generated information.

10 Claims, 4 Drawing Sheets

(51) Int. Cl.
　　　*H01L 21/304*　　　(2006.01)
　　　*H01L 21/68*　　　(2006.01)
(52) U.S. Cl.
　　　CPC ....... *G06Q 50/04* (2013.01); *G05B 19/41815* (2013.01); *H01L 21/304* (2013.01); *H01L 21/68* (2013.01); *Y02P 90/02* (2015.11); *Y02P 90/30* (2015.11)
(58) Field of Classification Search
　　　CPC ....... H01L 21/304; H01L 21/68; H01L 21/02; Y02P 90/02; Y02P 90/30
　　　See application file for complete search history.

(56) References Cited

U.S. PATENT DOCUMENTS

| 6,556,949 | B1 | 4/2003 | Lyon |
| 2004/0002784 | A1* | 1/2004 | Yoshida ............... H01L 21/6715 |
| | | | 700/108 |
| 2007/0004052 | A1* | 1/2007 | Wada ................... G03F 7/70991 |
| | | | 438/5 |
| 2007/0151321 | A1 | 7/2007 | Ohmi et al. |
| 2007/0225870 | A1 | 9/2007 | Davidkovich et al. |
| 2008/0266537 | A1* | 10/2008 | Abuku ................... G03B 27/42 |
| | | | 355/53 |
| 2018/0210423 | A1* | 7/2018 | Yamamoto ........... G05B 19/408 |
| 2019/0035657 | A1* | 1/2019 | Asai .................. H01L 21/67276 |

FOREIGN PATENT DOCUMENTS

| JP | 2004-025058 A | | 1/2004 |
| JP | 2009-016379 A | | 1/2009 |
| JP | 2009295658 A | * | 12/2009 |
| JP | 2012-222080 A | | 11/2012 |
| JP | 5436797 B | | 3/2014 |

* cited by examiner

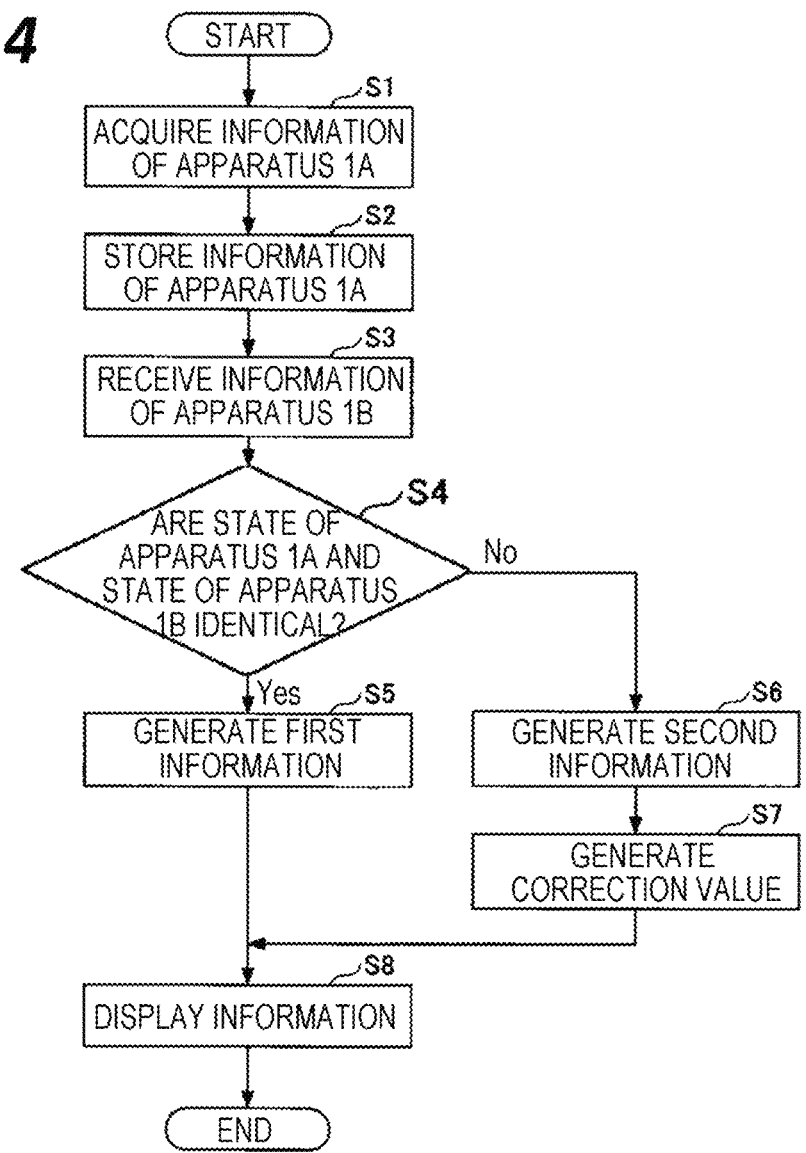

| OPENING DEGREE, % OF APC VALVE \ SUPPLY FLOW RATE, L OF $N_2$ GAS | ... | y | ... |
|---|---|---|---|
| ⋮ | | ⋮ | |
| 3.0 | | 4.1 | |
| 4.0 | | 3.7 | |
| ⋮ | | ⋮ | |

| OPENING DEGREE, % OF APC VALVE \ SUPPLY FLOW RATE, L OF $N_2$ GAS | ... | y | ... |
|---|---|---|---|
| ⋮ | | | |
| 3.0 | | | |
| 4.0 | | X1 | |
| ⋮ | | | |

SEMICONDUCTOR SYSTEM

CROSS-REFERENCE TO RELATED APPLICATIONS

This application is a continuation of U.S. patent application Ser. No. 15/662,504 filed on Jul. 28, 2017, which claims priority from Japanese Patent Application No. 2016-154283 filed on Aug. 5, 2016 with the Japan Patent Office, all of which are incorporated herein in their entireties by reference.

TECHNICAL FIELD

The present disclosure relates to a semiconductor system.

BACKGROUND

In a semiconductor system in which semiconductor devices are manufactured using a plurality of semiconductor manufacturing apparatuses, the quality of semiconductor devices may vary due to, for example, individual differences of the semiconductor manufacturing apparatuses or different installation environments of the semiconductor manufacturing apparatuses.

Therefore, in the past, in order to reduce variation in the quality of semiconductor devices, engineers skilled in the semiconductor manufacturing apparatuses check, for example, the state of each semiconductor manufacturing apparatus, and adjust the semiconductor manufacturing apparatus. There is also known a method of connecting a dedicated system to a plurality of semiconductor manufacturing apparatuses and comparing and editing, for example, parameters of the plurality of semiconductor manufacturing apparatuses using a dedicated system (see, e.g., Japanese Patent No. 5436797 and Japanese Patent Laid-open Publication Nos. 2003-217995 and H11-340111).

SUMMARY

According to an aspect of the present disclosure, there is provided a semiconductor system including a first semiconductor manufacturing apparatus and a second semiconductor manufacturing apparatus that share information on a semiconductor manufacturing apparatus by directly communicating the information therebetween. The first semiconductor manufacturing apparatus includes: a first acquisition unit configured to acquire first information on the first semiconductor manufacturing apparatus; a first storage unit configured to store the first information acquired by the first acquisition unit; and a first communication unit configured to send the first information stored in the first storage unit to the second semiconductor manufacturing apparatus. The second semiconductor manufacturing apparatus includes: a second acquisition unit configured to acquire second information on the second semiconductor manufacturing apparatus; a second storage unit configured to store the second information acquired by the second acquisition unit; a second communication unit configured to receive the first information sent from the first semiconductor manufacturing apparatus; an analysis unit configured to analyze a state of the second semiconductor manufacturing apparatus based on the first information received by the second communication unit and the second information stored in the second storage unit; an information generation unit configured to generate information that visualizes an analysis result of the analysis unit; and a display unit configured to display information generated by the information generation unit.

The foregoing summary is illustrative only and is not intended to be in any way limiting. In addition to the illustrative aspects, embodiments, and features described above, further aspects, embodiments, and features will become apparent by reference to the accompanying drawings and the following detailed description.

BRIEF DESCRIPTION OF THE DRAWINGS

FIG. 4 is a flowchart illustrating an exemplary processing by the semiconductor system according to the exemplary embodiment.

FIG. 5 is a diagram illustrating an exemplary exhaust profile of a semiconductor manufacturing apparatus 1A.

DETAILED DESCRIPTION

Figure 1:
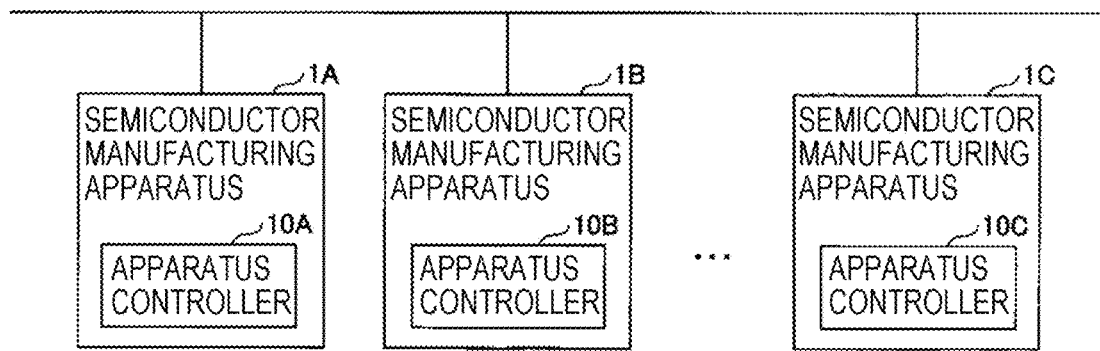
FIG. 1 is an overall configuration diagram illustrating an example of a semiconductor system according to an exemplary embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

It is undesirable from the viewpoint of time and cost that engineers adjust respective semiconductor manufacturing apparatuses, and the adjustment results tend to vary. In the methods disclosed in Japanese Patent No. 5436797 and Japanese Patent Laid-open Publication Nos. 2003-217995 and H11-340111, it is required to introduce a dedicated system separately from the semiconductor manufacturing apparatuses, which is undesirable from the viewpoint of cost. Therefore, there is a need for a semiconductor system capable of performing direct communication among a plurality of semiconductor manufacturing apparatuses without introducing a dedicated system.

An aspect of the present disclosure provides a semiconductor system capable of performing direct communication among a plurality of semiconductor manufacturing apparatuses.

According to an aspect of the present disclosure, there is provided a semiconductor system according to an aspect of the present disclosure including a first semiconductor manufacturing apparatus and a second semiconductor manufacturing apparatus that share information on a semiconductor manufacturing apparatus by directly communicating the information therebetween. The first semiconductor manufacturing apparatus includes: a first acquisition unit configured to acquire first information on the first semiconductor manufacturing apparatus; a first storage unit configured to store the first information acquired by the first acquisition unit; and a first communication unit configured to send the first information stored in the first storage unit to the second semiconductor manufacturing apparatus. The second semiconductor manufacturing apparatus includes: a second acquisition unit configured to acquire second information on the second semiconductor manufacturing apparatus; a second storage unit configured to store the second information acquired by the second acquisition unit; a second communication unit configured to receive the first information sent from the first semiconductor manufacturing apparatus; an analysis unit configured to analyze a state of the second semiconductor manufacturing apparatus based on the first information received by the second communication unit and the second information stored in the second storage unit; an information generation unit configured to generate information that visualizes an analysis result of the analysis unit; and a display unit configured to display information generated by the information generation unit.

In the above-described semiconductor system, the analysis unit compares the second information acquired by the second acquisition unit with the first information received by the second communication unit to determine whether the state of the second semiconductor manufacturing apparatus is identical to a state of the first semiconductor manufacturing apparatus.

In the above-described semiconductor system, when a difference between the first information and the second information when the first semiconductor manufacturing apparatus and the second semiconductor manufacturing apparatus are caused to perform the same operation is included in a predetermined range, the analysis unit determines that the state of the second semiconductor manufacturing apparatus is identical to the state of the first semiconductor manufacturing apparatus. When the difference between the first information and the second information when the first semiconductor manufacturing apparatus and the second semiconductor manufacturing apparatus are caused to perform the same operation is not included in the predetermined range, the analysis unit determines that the state of the second semiconductor manufacturing apparatus is different from the state of the first semiconductor manufacturing apparatus.

In the above-described semiconductor system, when the analysis unit determines that the state of the second semiconductor manufacturing apparatus is different from the state of the first semiconductor manufacturing apparatus, the information generation unit generates a correction value for matching a characteristic of a semiconductor device manufactured by the second semiconductor manufacturing apparatus with a characteristic of a semiconductor device manufactured by the first semiconductor manufacturing apparatus.

In the above-described semiconductor system, the first information and the second information are set values to be used when controlling operations of respective units of the first semiconductor manufacturing apparatus and the second semiconductor manufacturing apparatus.

In the above-described semiconductor system, the first information and the second information are state logs of respective units of the first semiconductor manufacturing apparatus and the second semiconductor manufacturing apparatus when a predetermined operation is executed in the first semiconductor manufacturing apparatus and the second semiconductor manufacturing apparatus.

In the above-described semiconductor system, the first information and the second information are values that vary depending on an environment in which the first semiconductor manufacturing apparatus and the second semiconductor manufacturing apparatus are installed, respectively.

According to a semiconductor system disclosed herein, it is possible to provide a semiconductor system in which direct communication is capable of being performed among a plurality of semiconductor manufacturing apparatuses.

Hereinafter, exemplary embodiments of the present disclosure will be described with reference to the accompanying drawings. In the present specification and drawings, substantially the same components will be denoted by the same symbols, and redundant descriptions will be omitted.

(Semiconductor System)

A semiconductor system according to an exemplary embodiment of the present disclosure will be described. FIG. 1 is an overall configuration diagram illustrating an example of a semiconductor system according to the exemplary embodiment.

As illustrated in FIG. 1, the semiconductor system has a plurality of (e.g., three) semiconductor manufacturing apparatuses 1A, 1B, and 1C.

The semiconductor manufacturing apparatuses 1A, 1B, and 1C perform a predetermined semiconductor processing on a processing target object, and manufacture, for example, a liquid crystal panel, an organic electroluminescence display, and a plasma display panel. The processing target object is, for example, a semiconductor wafer or a glass substrate. The semiconductor processing may include at least a processing related to a semiconductor. As the processing related to a semiconductor, for example, a film formation processing, an etching processing, or a thermal oxidation processing may be mentioned. The semiconductor manufacturing apparatuses 1A, 1B, and 1C may be a batch type apparatus or a single sheet type apparatus.

The semiconductor manufacturing apparatuses 1A, 1B, and 1C are provided with apparatus controllers 10A, 10B, and 10C that control operations of respective components of the apparatuses, respectively. The apparatus controllers 10A, 10B, and 10C are connected to the same communication network. The apparatus controllers 10A, 10B, and 10C are configured to share information on the semiconductor manufacturing apparatuses 1A, 1B, and 1C via a communication network by directly communicating with each other. For example, the apparatus controller 10A and the apparatus controller 10B share information on the semiconductor manufacturing apparatuses 1A and 1B by bidirectionally communicating the information therebetween. Further, for example, the apparatus controller 10A and the apparatus controller 10C shares information on the semiconductor manufacturing apparatuses 1A and 1C by bidirectionally communicating the information therebetween. Meanwhile, the communication network may be, for example, a network of a manufacturing execution system (MES) that manages manufacturing steps of the entire factory in which the semiconductor system is installed. Further, the communication network may be, for example, the Internet, an intranet, or a public telephone line network.

The apparatus controllers 10A, 10B, and 10C may have the same configuration or may have different configurations. However, a description will be made of a case where the apparatus controllers 10A, 10B, and 10C have the same configuration by way of an example. Hereinafter, among the apparatus controllers 10A, 10B, and 10C having the same configuration, the apparatus controller 10A will be described, and a description of the apparatus controllers 10B and 10C will be omitted.

(Apparatus Controller)

Figure 2:
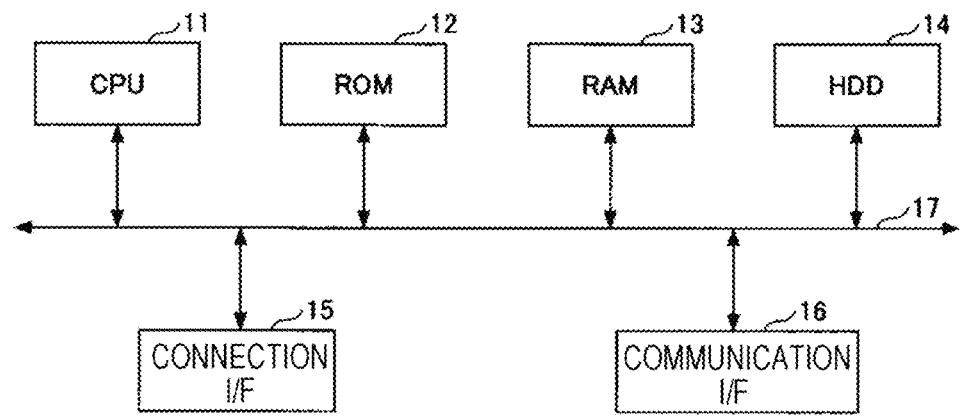
FIG. 2 is a diagram illustrating an exemplary hardware configuration of an apparatus controller.

An example of the hardware configuration of the apparatus controller 10A will be described. FIG. 2 is a diagram illustrating an exemplary hardware configuration of the apparatus controller 10A.

As illustrated in FIG. 2, the apparatus controller 10A includes a central processing unit (CPU) 11, a read only memory (ROM) 12, a random access memory (RAM) 13, a hard disk drive (HDD) 14, a connection interface (I/F) 15, and a communication I/F 16 which are connected with each other via a bus 17.

The CPU 11 controls the overall operation of the semiconductor manufacturing apparatus 1A by executing a program stored in, for example, the ROM 12 or the HDD 14 using the RAM 13 as a work area. Each component of the semiconductor manufacturing apparatus 1A is connected to the connection I/F 15. The communication I/F 16 is an interface for communicating with other apparatus controllers 10B and 10C by wired or wireless communication.

In the apparatus controller 10A, a program for causing a processing target object to perform a predetermined semiconductor processing is installed in advance. Then, process managers perform an operation of causing the semiconductor manufacturing apparatus 1A having a program installed therein to perform various substrate processings via the apparatus controller 10A.

Figure 3:
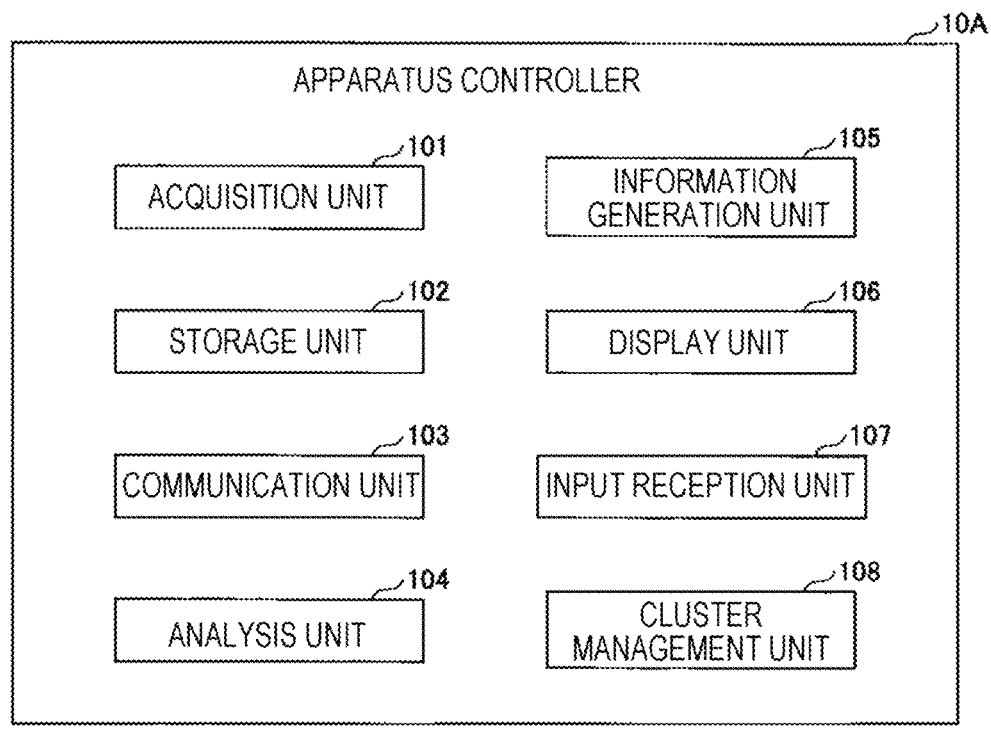
FIG. 3 is a block diagram illustrating an exemplary functional configuration of the apparatus controller.

An example of a functional configuration of the apparatus controller 10A will be described. FIG. 3 is a block diagram illustrating the functional configuration of the apparatus controller 10A. The function of the apparatus controller 10A to be described below is implemented by executing a predetermined program in the above-described CPU 11. The program may be acquired via a recording medium, may be acquired via a communication network, or may be incorporated into the ROM 12.

As illustrated in FIG. 3, the apparatus controller 10A includes an acquisition unit 101, a storage unit 102, a communication unit 103, an analysis unit 104, an information generation unit 105, a display unit 106, an input reception unit 107, and a cluster management unit 108.

The acquisition unit 101 has a function of acquiring information on the semiconductor manufacturing apparatus 1A. Information on the semiconductor manufacturing apparatus 1A includes, for example, parameters, history data, and installation environment data.

The parameters are set values or adjustment values that are used when controlling the operations of respective components of the semiconductor manufacturing apparatus, and may include, for example, the zero points of a heater, a vacuum gauge, and a flow rate controller. By comparing the parameters in a plurality of semiconductor manufacturing apparatuses, the differences between, for example, the apparatus configurations may be grasped.

The history data is a state log of each component of the semiconductor manufacturing apparatus when the semiconductor manufacturing apparatus is caused to execute a predetermined operation, and may include, for example, the opening degree of an automatic pressure control (APC) valve and the value measured by, for example, a temperature sensor, a pressure sensor, or a flow rate sensor. Further, the history data may be a representative value obtained by performing a predetermined calculation on the opening degree of the APC valve or the value measured by a sensor, for example, an average value or a standard deviation. The predetermined operation is determined in advance in accordance with, for example, the type of the history data. By comparing the history data in a plurality of semiconductor manufacturing apparatuses, the differences, for example, in the condition of or in the accumulated substrate processing situation of the respective semiconductor manufacturing apparatuses may be determined.

The installation environment data is a value that varies depending on the environment in which the semiconductor manufacturing apparatus is installed, and may include, for example, values of exhaust conductance, cooling water supply flow rate, and gas supply pressure. By comparing the installation environment data of a plurality of semiconductor manufacturing apparatuses under the same condition, for example, a difference in the environments where the respective semiconductor manufacturing apparatuses are installed may be understood.

The storage unit 102 has a function of storing information on the semiconductor manufacturing apparatus 1A acquired by the acquisition unit 101. Further, the storage unit 102 has a function of storing a cluster ID that specifies the cluster to which the semiconductor manufacturing apparatus 1A belongs. The cluster ID may be, for example, an IP address or a communication port. In the present specification, the term "cluster" means a system in which a plurality of semiconductor manufacturing apparatuses are grouped.

The communication unit 103 has a function of sending the information on the semiconductor manufacturing apparatus 1A and the cluster ID stored in the storage unit 102 to other apparatus controllers, for example, the apparatus controllers 10B and 10C. Further, the communication unit 103 has a function of receiving the information on the semiconductor manufacturing apparatuses 1B and 1C and the cluster ID received from other apparatus controllers, for example, the apparatus controllers 10B and 10C. Meanwhile, the information on the semiconductor manufacturing apparatuses 1B and 1C and the cluster ID received by the communication unit 103 may be stored in the storage unit 102.

The analysis unit 104 has a function of analyzing the state of the semiconductor manufacturing apparatus 1A based on the information on the other semiconductor manufacturing apparatuses 1B and 1C received by the communication unit 103 and the information on the semiconductor manufacturing apparatus 1A stored in the storage unit 102. For example, the analysis unit 104 compares the information on the semiconductor manufacturing apparatus 1A with the information on the other semiconductor manufacturing apparatus 1B received by the communication unit 103 to determine whether the state of the semiconductor manufacturing apparatus 1A is identical to the state of the semiconductor manufacturing apparatus 1B. Specifically, for example, when the difference between the history data of the semiconductor manufacturing apparatus 1A and the history data of the semiconductor manufacturing apparatus 1B when the semiconductor manufacturing apparatus 1A and the semiconductor manufacturing apparatus 1B are caused to execute the same operation is included in a predetermined range, it is determined that the states of both are the same. When the difference between the history data of the semiconductor manufacturing apparatus 1A and the history data of the semiconductor manufacturing apparatus 1B when the semiconductor manufacturing apparatus 1A and the semiconductor manufacturing apparatus 1B are caused to execute the same operation is not included in the predetermined range, it is determined that the states of the semiconductor manufacturing apparatus 1A and the semiconductor manufacturing apparatus 1B are different from each other.

The information generation unit 105 has a function of generating information that visualizes the state of the semiconductor manufacturing apparatus 1A based on the analysis results of the analysis unit 104. For example, when it is determined by the analysis unit 104 that the state of the semiconductor manufacturing apparatus 1A is identical to the state of the semiconductor manufacturing apparatus 1B, the information generation unit 105 generates information representing that the states of the semiconductor manufacturing apparatus 1A and the semiconductor manufacturing apparatus 1B are identical to each other. Further, for example, when it is determined by the analysis unit 104 that the state of the semiconductor manufacturing apparatus 1A is different from the state of the semiconductor manufacturing apparatus 1B, the information generation unit 105 generates information representing that the state of the semiconductor manufacturing apparatus 1A and the state of the semiconductor manufacturing apparatus 1B are different from each other. In addition, for example, when it is determined by the analysis unit 104 that the state of the semiconductor manufacturing apparatus 1A is different from the state of the semiconductor manufacturing apparatus 1B, the information generation unit 105 generates a correction value to match the characteristic of the semiconductor device manufactured by the semiconductor manufacturing apparatus 1A with the characteristic of the semiconductor device manufactured by the semiconductor manufacturing apparatus 1B.

The display unit 106 has a function of displaying the information generated by the information generation unit 105.

The input reception unit 107 has a function of receiving an operation input of process managers.

The cluster management unit 108 has a function of determining whether one semiconductor manufacturing apparatus belongs to the same cluster as other semiconductor manufacturing apparatuses. For example, when it is determined whether the semiconductor manufacturing apparatus 1A and the semiconductor manufacturing apparatus 1B belong to the same cluster, the cluster ID stored in the storage unit 102 of the semiconductor manufacturing apparatus 1A is compared with the cluster ID stored in the storage unit of the semiconductor manufacturing apparatus 1B. When the cluster ID of the semiconductor manufacturing apparatus 1A matches the cluster ID of the semiconductor manufacturing apparatus 1B, it is determined that the semiconductor manufacturing apparatus 1A and the semiconductor manufacturing apparatus 1B belong to the same cluster. Meanwhile, for example, when the semiconductor manufacturing apparatus 1A is newly added to a specific cluster, the process managers input the network ID of the device which already belongs to the cluster to be joined so that the semiconductor manufacturing apparatus 1A may join a new cluster.

(Operation)

An example of a processing by the semiconductor system according to an exemplary embodiment of the present disclosure will be described. Hereinafter, a description will be made of a case where the state of the semiconductor manufacturing apparatus 1A is matched with the state of the semiconductor manufacturing apparatus 1B with reference to the state of the semiconductor manufacturing apparatus 1B, by way of an example. Meanwhile, the processing by the semiconductor system may be performed as long as information on the semiconductor manufacturing apparatus is directly communicated and shared among a plurality of semiconductor manufacturing apparatuses, but the processing is not limited to matching the state of one semiconductor manufacturing apparatus with the states of the other semiconductor manufacturing apparatuses. For example, one semiconductor manufacturing apparatus may refer to another semiconductor manufacturing apparatus, or information on one semiconductor manufacturing apparatus may be copied to another semiconductor manufacturing apparatus.

FIG. 4 is a flowchart illustrating an exemplary processing by the semiconductor system according to the exemplary embodiment.

When an operation input is made by the process managers to match the state of the semiconductor manufacturing apparatus 1A with the state of the semiconductor manufacturing apparatus 1B by referring to the state of the semiconductor manufacturing apparatus 1B, the acquisition unit 101 acquires information on the semiconductor manufacturing apparatus 1A (step S1).

Next, the acquisition unit 101 stores the acquired information on the semiconductor manufacturing apparatus 1A in the storage unit 102 (step S2).

Next, the communication unit 103 receives information on the semiconductor manufacturing apparatus 1B (step S3).

Next, based on the information on the semiconductor manufacturing apparatus 1A stored in the storage unit 102 and the information on the semiconductor manufacturing apparatus 1B received by the communication unit 103, the analysis unit 104 determines whether the state of the semiconductor manufacturing apparatus 1A is identical to the state of the semiconductor manufacturing apparatus 1B (step S4).

In step S4, when the analysis unit 104 determines that the state of the semiconductor manufacturing apparatus 1A is identical to the state of the semiconductor manufacturing apparatus 1B, the information generation unit 105 generates information representing that the states of the semiconductor manufacturing apparatus 1A and the semiconductor manufacturing apparatus 1B are identical to each other (step S5).

In step S4, when the analysis unit 104 determines that the state of the semiconductor manufacturing apparatus 1A is different from the state of the semiconductor manufacturing apparatus 1B, the information generation unit 105 generates information representing that the states of the semiconductor manufacturing apparatus 1A and the semiconductor manufacturing apparatus 1B are different from each other (step S6). Further, the information generation unit 105 generates a correction value to match the characteristic of a semiconductor device manufactured by the semiconductor manufacturing apparatus 1A with the characteristic of a semiconductor device manufactured by the semiconductor manufacturing apparatus 1B.

Next, the display unit 106 displays the information generated by the information generation unit 105 (step S8) and ends the processing. That is, in step S4, when the analysis unit 104 determines that the state of the semiconductor manufacturing apparatus 1A is identical to the state of the semiconductor manufacturing apparatus 1B, the display unit 106 displays first information generated by the information generation unit 105. In step S4, when the analysis unit 104 determines that the state of the semiconductor manufacturing apparatus 1A is different from the state of the semiconductor manufacturing apparatus 1B, the display unit 106 displays second information and the correction value generated by the information generation unit 105.

An example of the processing by the semiconductor system according to the exemplary embodiment has been described above, but the processing by the semiconductor system may be changed as follows.

For example, when the analysis unit 104 determines that the state of the semiconductor manufacturing apparatus 1A is different from the state of the semiconductor manufacturing apparatus 1B, the step of generating the correction value by the information generation unit 105 (step S7) may be omitted. In this case, in step S8, the display unit 106 displays only the second information generated by the information generation unit 105.

Further, for example, a step of storing the first information, the second information, and the correction value generated by the information generation unit 105 in the storage unit 102 may be included.

In addition, for example, when an operation input is made by the process managers to match the state of the semiconductor manufacturing apparatus 1A with the state of the semiconductor manufacturing apparatus 1B by referring to the state of the semiconductor manufacturing apparatus 1B, a step of determining by the cluster management unit 108 whether the semiconductor manufacturing apparatus 1B belongs to the same cluster as the semiconductor manufacturing apparatus 1A may be included prior to step S1. In this case, when the cluster management unit 108 determines that the semiconductor manufacturing apparatus 1B belongs to the same cluster as the semiconductor manufacturing apparatus 1A, step S1 is performed.

Next, a specific example of the processing by the semiconductor system will be described. In the following description, an example will be described in which a correction value is calculated by comparing an exhaust profile of the semiconductor manufacturing apparatus 1A with an exhaust profile of the semiconductor manufacturing apparatus 1B. The exhaust profile is an example of information on the semiconductor manufacturing apparatus.

First, the acquisition unit 101 acquires the exhaust profile of the semiconductor manufacturing apparatus 1A (step S1). The exhaust profile of the semiconductor manufacturing apparatus 1A is a pressure change when the semiconductor manufacturing apparatus 1A is operated under a plurality of previously prepared conditions. FIG. 5 is a diagram illustrating an exemplary exhaust profile of the semiconductor manufacturing apparatus 1A. As illustrated in FIG. 5, the exhaust profile of the semiconductor manufacturing apparatus 1A may be a pressure change in a processing vessel when changing the opening degree of the APC valve and the supply flow rate of an $N_2$ gas, respectively. Meanwhile, in FIG. 5, the unit for the opening degree of the APC valve is a percentage (%), the unit for the supply flow rate of the $N_2$ gas is liter (L), and the unit for the pressure is pascal (Pa). In an exemplary embodiment, as illustrated in FIG. 5, when the opening degree of the APC valve is 3.0% and the supply flow rate of the $N_2$ gas is y (L), the pressure in the processing vessel is 3.8 Pa. Further, when the opening degree of the APC valve is 4.0% and the supply flow rate of the $N_2$ gas is y (L), the pressure in the processing vessel is 3.5 Pa.

Next, the acquisition unit 101 stores the acquired information in the storage unit 102 (step S2).

Figures 6, 7, 8:
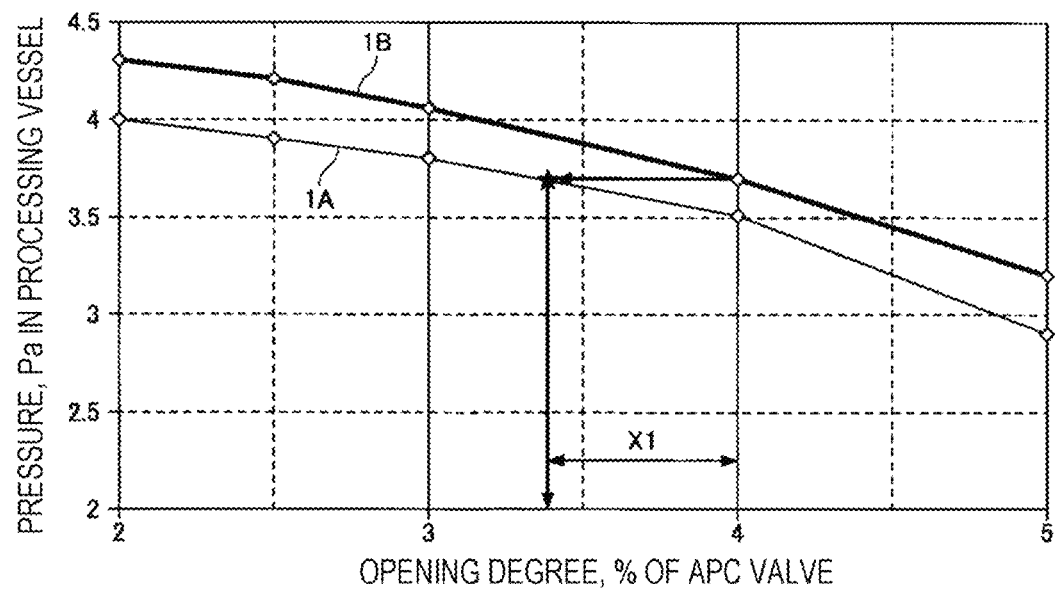
FIG. 6 is a diagram illustrating an exemplary exhaust profile of a semiconductor manufacturing apparatus 1B.
FIG. 7 is a diagram illustrating a relationship between the exhaust profile of the semiconductor manufacturing apparatus 1A and the exhaust profile of the semiconductor manufacturing apparatus 1B.
FIG. 8 is a diagram illustrating an exemplary correction value table.

Next, the communication unit 103 acquires the exhaust profile of the semiconductor manufacturing apparatus 1B stored in the storage unit of the apparatus controller 10B of the semiconductor manufacturing apparatus 1B (step S3). The exhaust profile of the semiconductor manufacturing apparatus 1B is a pressure change when the semiconductor manufacturing apparatus 1B is operated under a plurality of previously prepared conditions in the same manner as in the semiconductor manufacturing apparatus 1A. FIG. 6 is a diagram illustrating an exemplary exhaust profile of the semiconductor manufacturing apparatus 1B. As illustrated in FIG. 6, the exhaust profile of the semiconductor manufacturing apparatus 1B may be a pressure change in a processing vessel when changing the opening degree of the APC valve and the supply flow rate of an $N_2$ gas, respectively. Meanwhile, in FIG. 6, the unit for the opening degree of the APC valve is a percentage (%), the unit for the supply flow rate of the $N_2$ gas is liter (L), and the unit for the pressure is pascal (Pa). In an exemplary embodiment, as illustrated in FIG. 6, when the opening degree of the APC valve is 3.0% and the supply flow rate of the $N_2$ gas is y (L), the pressure in the processing vessel is 4.1 Pa. Further, when the opening degree of the APC valve is 4.0% and the supply flow rate of the $N_2$ gas is y (L), the pressure in the processing vessel is 3.7 Pa.

Next, based on the exhaust profile of the semiconductor manufacturing apparatus 1A stored in the storage unit 102 and the exhaust profile of the semiconductor manufacturing apparatus 1B received by the communication unit 103, the analysis unit 104 determines whether the state of the semiconductor manufacturing apparatus 1A is identical to the state of the semiconductor manufacturing apparatus 1B (step S4). A determination on whether the state of the semiconductor manufacturing apparatus 1A is identical to the state of the semiconductor manufacturing apparatus 1B may be made, for example, based on whether the difference between the exhaust profile of the semiconductor manufacturing apparatus 1A and the exhaust profile of the semiconductor manufacturing apparatus 1B is included in a predetermined range. In the exemplary embodiment, for example, when the difference between the exhaust profile of the semiconductor manufacturing apparatus 1A and the exhaust profile of the semiconductor manufacturing apparatus 1B is equal to or smaller than 0.1 Pa, it is determined that the state of the semiconductor manufacturing apparatus 1A is identical to the state of the semiconductor manufacturing apparatus 1B. When the difference between the exhaust profile of the semiconductor manufacturing apparatus 1A and the exhaust profile of the semiconductor manufacturing apparatus 1B is larger than 0.1 Pa, it may be determined that the state of the semiconductor manufacturing apparatus 1A is different from the state of the semiconductor manufacturing apparatus 1B. In the exemplary embodiment, as illustrated in FIGS. 5 and 6, since the difference between the exhaust profile of the semiconductor manufacturing apparatus 1A and the exhaust profile of the semiconductor manufacturing apparatus 1B at the same opening degree of the APC valve is larger than 0.1 Pa, it is determined that the state of the semiconductor manufacturing apparatus 1A is different from the state of the semiconductor manufacturing apparatus 1B.

Next, the information generation unit 105 generates information (second information) representing that the state of the semiconductor manufacturing apparatus 1A is different from the state of the semiconductor manufacturing apparatus 1B (step S6). Further, the information generation unit 105 generates a correction value to match the characteristic of a semiconductor device manufactured by the semiconductor manufacturing apparatus 1A with the characteristic of a semiconductor device manufactured by the semiconductor manufacturing apparatus 1B (step S7). FIG. 7 is a diagram illustrating a relationship between the exhaust profile of the semiconductor manufacturing apparatus 1A and the exhaust profile of the semiconductor manufacturing apparatus 1B. In FIG. 7, the horizontal axis represents the opening degree % of the APC valve and the vertical axis represents the pressure Pa in the processing vessel of the semiconductor manufacturing apparatuses 1A and 1B. As illustrated in FIG. 7, for example, the information generation unit 105 calculates the opening degree of the APC valve of the semiconductor manufacturing apparatus 1B, which has the same pressure as the pressure in the processing vessel when the opening degree of the APC valve of the semiconductor manufacturing apparatus 1A is 4.0 Pa. Further, the information generation unit 105 calculates the difference between the opening degree of the APC valve of the semiconductor manufacturing apparatus 1A and the opening degree of the APC valve of the semiconductor manufacturing apparatus 1B so as to generate the difference as a correction value. In FIG. 7, the correction value is X1%. FIG. 8 is a diagram illustrating an exemplary correction value table. As illustrated in FIG. 8, since the correction value of the opening degree of the APC valve depends on a relationship among three variables, i.e., the pressure, the supply flow rate of the $N_2$ gas, and the opening degree of the APC valve, the correction may be made when executing the processing by calculating the correction value per supply flow rate of the $N_2$ gas.

Next, the display unit 106 displays the second information and the correction value generated by the information generation unit 105 (step S8) and ends the processing.

Meanwhile, in the above-described exemplary embodiment, the semiconductor manufacturing apparatus 1B is an example of a first semiconductor manufacturing apparatus, and the semiconductor manufacturing apparatus 1A is an example of a second semiconductor manufacturing apparatus.

As described above, in the semiconductor system of the exemplary embodiment, when the apparatus controller 10A receives an operation input by the process managers, the apparatus controller 10A compares the exhaust profile of the semiconductor manufacturing apparatus 1A with the exhaust profile of the semiconductor manufacturing apparatus 1B. The apparatus controller 10A also determines whether the state of the semiconductor manufacturing apparatus 1A is identical to the state of the semiconductor manufacturing apparatus 1B. For this reason, engineers skilled in the semiconductor manufacturing apparatus do not need to confirm, for example, the state of each semiconductor manufacturing apparatus, and process managers may easily determine whether it is required to adjust the semiconductor manufacturing apparatus 1A.

Further, in the semiconductor system of the exemplary embodiment, based on the exhaust profile of the semiconductor manufacturing apparatus 1A and the exhaust profile of the semiconductor manufacturing apparatus 1B, the apparatus controller 10A calculates a correction value so that the state of the semiconductor manufacturing apparatus 1A is equal to the state of the semiconductor manufacturing apparatus 1B. For this reason, even when the exhaust profile of the semiconductor manufacturing apparatus 1A is different from the exhaust profile of the semiconductor manufacturing apparatus 1B, the process managers may easily adjust the semiconductor manufacturing apparatus 1A. As a result, the occurrence of variations in the quality of the semiconductor manufacturing apparatuses may be suppressed even when manufacturing the semiconductor device using a plurality of semiconductor manufacturing apparatuses.

Further, in the semiconductor system of the exemplary embodiment, the process managers may easily determine whether it required to adjust the semiconductor manufacturing apparatuses and then easily adjust the semiconductor manufacturing apparatuses. This may shorten the time required to carry apparatuses into a semiconductor factory and operate the apparatuses, and may facilitate maintenance and management of the apparatuses.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A semiconductor system comprising:
a first semiconductor manufacturing apparatus and a second semiconductor manufacturing apparatus that share information on a semiconductor manufacturing apparatus by directly communicating the information therebetween,
wherein the first semiconductor manufacturing apparatus includes:
a first memory configured to store a first ID; and
a first processor coupled to the first memory and configured to:
acquire first information including a first exhaust profile of the first semiconductor manufacturing apparatus, the first exhaust profile including an opening degree of a valve, a supply flow rate of a gas and a first pressure in a first chamber;
store the acquired first information in the first memory; and
send the first information stored in the first memory to the second semiconductor manufacturing apparatus, and
wherein the second semiconductor manufacturing apparatus includes:
a second memory configured to store a second ID; and
a second processor coupled to the second memory and configured to:
determine whether the first semiconductor manufacturing apparatus belongs to a same cluster as the second semiconductor manufacturing apparatus using the first ID and the second ID, the same cluster representing an apparatus group in which a plurality of semiconductor manufacturing apparatuses is provided, and each of the first ID and the second ID representing an IP address of an apparatus group to which each of the first semiconductor manufacturing apparatus and the second semiconductor manufacturing apparatus belongs; wherein, when the first ID and the second ID are identical to each other, the second processor determines that the first semiconductor manufacturing apparatus belongs to the same cluster as the second semiconductor manufacturing apparatus,
acquire second information including a second exhaust profile of the second semiconductor manufacturing apparatus, the second exhaust profile including an opening degree of a valve, a supply flow rate of a gas and a second pressure in a second chamber;
store the acquired second information in the second memory;
receive the first information sent from the first semiconductor manufacturing apparatus;
analyze a state of the second semiconductor manufacturing apparatus based on the received first information and the second information stored in the second memory;
generate information that visualizes an analysis result of the state of the second semiconductor manufacturing apparatus; and
display the information generated by the second processor, wherein, when determined that the first semiconductor manufacturing apparatus belongs to the same cluster as the second semiconductor manufacturing apparatus, the second processor:

analyzes the state of the second semiconductor manufacturing apparatus based on the first information and the second information, and compares the second information acquired by the second processor with the first information received by the second processor to determine whether the state of the second semiconductor manufacturing apparatus is identical to a state of the first semiconductor manufacturing apparatus, when determined that the state of the second semiconductor manufacturing apparatus is identical to the state of the first semiconductor manufacturing apparatus, the second processor:

generates information indicating that the state of the first semiconductor manufacturing apparatus is identical to the state of the second semiconductor manufacturing apparatus; and displays the information indicating that the states are identical to each other, and when determined that the state of the second semiconductor manufacturing apparatus is different from the state of the first semiconductor manufacturing apparatus, the second processor:

generates information indicating that the state of the first semiconductor manufacturing apparatus is different from the state of the second semiconductor manufacturing apparatus;

generates a correction value for matching a characteristic of a semiconductor device manufactured by the second semiconductor manufacturing apparatus with a characteristic of a semiconductor device manufactured by the first semiconductor manufacturing apparatus; and displays the information indicating that the states are different from each other.

2. The semiconductor system of claim 1, wherein, when a difference value between the first information and the second information when the first semiconductor manufacturing apparatus and the second semiconductor manufacturing apparatus are caused to perform a same operation is within a predetermined range, the second processor determines that the state of the second semiconductor manufacturing apparatus is identical to the state of the first semiconductor manufacturing apparatus, and when the difference value between the first information and the second information when the first semiconductor manufacturing apparatus and the second semiconductor manufacturing apparatus are caused to perform the same operation is out of the predetermined range, the second processor determines that the state of the second semiconductor manufacturing apparatus is different from the state of the first semiconductor manufacturing apparatus.

3. The semiconductor system of claim 2, wherein the first information and the second information are set values to be used when controlling operations of the first semiconductor manufacturing apparatus and the second semiconductor manufacturing apparatus.

4. The semiconductor system of claim 2, wherein the first information and the second information are state logs of the first semiconductor manufacturing apparatus and the second semiconductor manufacturing apparatus when a predetermined operation is executed in the first semiconductor manufacturing apparatus and the second semiconductor manufacturing apparatus.

5. The semiconductor system of claim 2, wherein the first information and the second information are values that vary depending on an environment in which each of the first semiconductor manufacturing apparatus and the second semiconductor manufacturing apparatus is installed.

6. The semiconductor system of claim 2, wherein the correction value is generated based on the difference value.

7. The semiconductor system of claim 6, wherein, when determined that the state of the second semiconductor manufacturing apparatus is different from the state of the first semiconductor manufacturing apparatus, the second processor performs a correction such that the difference value becomes within the predetermined range.

8. The semiconductor system of claim 1, wherein the first information and the second information are set values used when controlling operations of the first semiconductor manufacturing apparatus and the second semiconductor manufacturing apparatus.

9. The semiconductor system of claim 1, wherein the first information and the second information are state logs of the first semiconductor manufacturing apparatus and the second semiconductor manufacturing apparatus when a predetermined operation is executed in the first semiconductor manufacturing apparatus and the second semiconductor manufacturing apparatus.

10. The semiconductor system of claim 1, wherein the first information and the second information are values that vary depending on an environment in which each of the first semiconductor manufacturing apparatus and the second semiconductor manufacturing apparatus is installed.

* * * * *